(12) United States Patent
Chen et al.

(10) Patent No.: US 11,854,729 B2
(45) Date of Patent: Dec. 26, 2023

(54) DIRECT LIQUID COOLED INDUCTOR

(71) Applicant: Ford Global Technologies, LLC, Dearborn, MI (US)

(72) Inventors: Lihua Chen, Farmington Hills, MI (US); Fan Wang, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1044 days.

(21) Appl. No.: 16/665,438

(22) Filed: Oct. 28, 2019

(65) Prior Publication Data
US 2021/0125768 A1   Apr. 29, 2021

(51) Int. Cl.
| | |
|---|---|
| *F16H 57/02* | (2012.01) |
| *F16H 57/04* | (2010.01) |
| *H01F 27/10* | (2006.01) |
| *H01F 27/02* | (2006.01) |

(52) U.S. Cl.
CPC ............ *H01F 27/10* (2013.01); *H01F 27/025* (2013.01)

(58) Field of Classification Search
CPC ........ H01F 27/10; H01F 27/025; H01F 37/00; H01F 41/005; H01F 41/04; F16H 57/0417; F16H 57/0476; H05K 7/20927; B60R 16/02
See application file for complete search history.

(56) References Cited

U.S. PATENT DOCUMENTS

| | | | |
|---|---|---|---|
| 9,299,488 B2 | 3/2016 | Shepard et al. | |
| 9,581,234 B2 | 2/2017 | Sung et al. | |
| 10,204,729 B2 | 2/2019 | Yonak et al. | |
| 10,736,233 B1 * | 8/2020 | Messer | H05K 7/20272 |
| 2014/0175867 A1 * | 6/2014 | Sung | F16H 57/0412 |
| | | | 307/9.1 |

* cited by examiner

*Primary Examiner* — Elim Ortiz
(74) *Attorney, Agent, or Firm* — Brooks Kushman P.C.; David Kelley

(57) ABSTRACT

A vehicle, a vehicle electronics power assembly, and a method for providing and cooling an inductor assembly are provided. The vehicle has provided with a vehicle electrical system with a variable voltage converter (VVC) and an inductor assembly with a core and a winding. A housing is provided with a first housing member and a second housing member. The first and second housing members cooperate to encapsulate the winding and at least a portion of the core of the inductor assembly. The first housing member defines a first inlet and a first outlet, and the second housing member defines a second inlet and a second outlet. A fluid system is connected to the first inlet, the second inlet, the first outlet, and the second outlet to provide pressurized fluid to the first and second inlets to circulate fluid through the housing.

20 Claims, 5 Drawing Sheets

DIRECT LIQUID COOLED INDUCTOR

TECHNICAL FIELD

Various embodiments relate to an inductor assembly for a power converter in a vehicle, and thermal management of the inductor assembly.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. Many electrified vehicles additionally include a DC-DC converter, also referred to as a variable voltage converter (VVC), to convert the voltage of the traction battery to an operational voltage level of the electric machine.

The voltage converter may be a buck-boost converter, with the voltage converter stepping up or increasing ("boosting") the output voltage magnitude in comparison to the input voltage magnitude, or stepping down or decreasing ("bucking") the output voltage magnitude in comparison to the input voltage magnitude. The DC-DC converter includes an inductor assembly, switches and diodes. The inductor assembly may generate heat during operation.

Previously, the inductor assembly has been cooled via indirect liquid cooling by placing it in a housing surrounded by a potting material and thermally connecting the housing to a cooling plate such that the inductor is cooled via conductive heat loss to the cooling plate and convective heat loss to the circulating fluid in the cooling plate. In this example, the fluid does not come into direct contact with the inductor assembly. Alternatively, the inductor assembly is cooled via direct liquid cooling by positioning an uncovered inductor assembly within a transmission case where transmission fluid within the transmission case can splash onto the inductor assembly before draining into the transmission sump; however, cooling of the inductor may be limited in this case when the transmission fluid is not being circulated, e.g. when the vehicle is standing or in park while operating.

SUMMARY

In an embodiment, a vehicle is provided with a vehicle electrical system with a variable voltage converter (VVC) and an inductor assembly. The inductor assembly has a core and a winding. A housing is provided with a first housing member and a second housing member. The first and second housing members cooperate to encapsulate the winding and at least a portion of the core of the inductor assembly. The first housing member defines a first inlet and a first outlet, and the second housing member defines a second inlet and a second outlet. A fluid system is connected to the first inlet, the second inlet, the first outlet, and the second outlet to provide pressurized fluid to the first and second inlets to circulate fluid through the housing.

In another embodiment, a vehicle power electronics assembly is provided with an inductor assembly having a core and a winding. A first housing member defines a first inlet and a first outlet. A second housing member defines a second inlet and a second outlet. The first and second housing members cooperate to encapsulate the winding and at least a portion of the core of the inductor assembly. An inner surface of each of the first and second housing members is spaced apart from an underlying outer surface of the inductor assembly to form a flow passage therebetween.

In yet another embodiment, a method for providing and cooling an inductor assembly includes providing a winding about a core to form an inductor assembly, and connecting first and second mounting brackets to opposite ends of the core of the inductor assembly. A first housing member is formed with a first inlet and a first outlet, and the first housing member defines a first cavity. A second housing member is formed with a second inlet and a second outlet, and the second housing member defines a second cavity. The winding and at least a portion of the core of the inductor assembly are encapsulated with the first and second cavities of the first and second housing members, and each of the first and second housing members are spaced apart from the winding and the at least a portion of the core to form a cooling passage therebetween. Pressurized fluid is provided to the first and second inlets in response to a current of the inductor assembly being above a threshold value.

DETAILED DESCRIPTION

As required, detailed embodiments of the present disclosure are provided herein; however, it is to be understood that the disclosed embodiments are merely examples and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
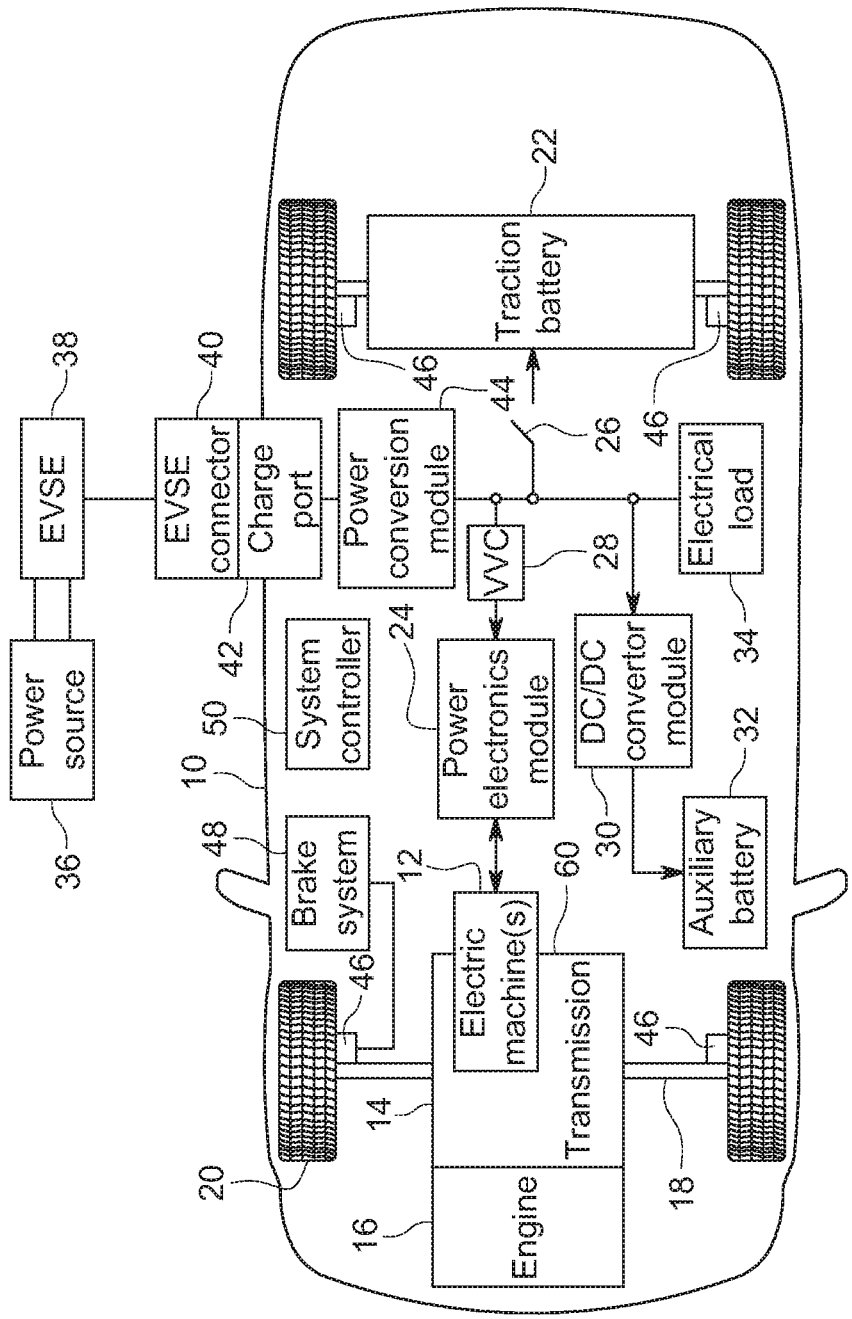
FIG. 1 illustrates a schematic of a vehicle according to an embodiment.

FIG. 1 illustrates a schematic of an electrified vehicle 10 that may be referred to as a plug-in hybrid-electric vehicle (PHEV). A plug-in hybrid-electric vehicle may comprise one or more electric machines 12 mechanically coupled to a hybrid transmission 14. The electric machines 12 may be capable of operating as a motor or a generator. In addition, the hybrid transmission 14 is mechanically coupled to an engine 16. The hybrid transmission 14 is also mechanically coupled to a drive shaft 18 that is mechanically coupled to the wheels 20. The electric machines 12 can provide propulsion and braking capability when the engine 16 is turned on or off. The electric machines 12 may also act as generators and can provide fuel economy benefits by recovering energy that would normally be lost as heat in a friction braking system. The electric machines 12 may also reduce vehicle emissions by allowing the engine 16 to operate at more efficient speeds and allowing the hybrid-electric vehicle 10 to be operated in electric mode with the engine 16 off under certain conditions. An electrified vehicle 10 may also be a battery electric vehicle (BEV). In a BEV configuration, the engine 16 may not be present. In other configurations, the electrified vehicle 10 may be a full hybrid-electric vehicle (FHEV) without plug-in capability, a micro-hybrid vehicle, a start-stop vehicle, or the like.

A traction battery or battery pack 22 stores energy that can be used by the electric machines 12. The vehicle battery pack 22 may provide a high voltage direct current (DC) output. The traction battery 22 may be electrically coupled to one or more power electronics modules 24. One or more contactors 26 may isolate the traction battery 22 from other components when opened and connect the traction battery 22 to other components when closed. The power electronics module 24 is also electrically coupled to the electric machines 12 and provides the ability to bi-directionally transfer energy between the traction battery 22 and the electric machines 12. For example, a traction battery 22 may provide a DC current while the electric machines 12 may operate with a three-phase alternating current (AC) to function. The power electronics module 24 may convert the DC current to a three-phase AC current to operate the electric machines 12. In a regenerative mode, the power electronics module 24 may convert the three-phase AC current from the electric machines 12 acting as generators to the DC current compatible with the traction battery 22.

The vehicle 10 may include a variable-voltage converter (VVC) 28 electrically coupled between the traction battery 22 and the power electronics module 24. The VVC 28 may be a DC/DC boost converter configured to increase or boost the voltage provided by the traction battery 22, or buck the voltage provided to the traction battery. By increasing the voltage, current requirements may be decreased leading to a reduction in wiring size for the power electronics module 24 and the electric machines 12. Further, the electric machines 12 may be operated with better efficiency and lower losses.

In addition to providing energy for propulsion, the traction battery 22 may provide energy for other vehicle electrical systems. The vehicle 10 may include a DC/DC converter module 30 that converts the high voltage DC output of the traction battery 22 to a low voltage DC supply that is compatible with low-voltage vehicle loads. An output of the DC/DC converter module 30 may be electrically coupled to an auxiliary battery 32 (e.g., 12V battery) for charging the auxiliary battery 32. The low-voltage systems may be electrically coupled to the auxiliary battery 32. One or more electrical loads 34 may be coupled to the high-voltage bus. The electrical loads 34 may have an associated controller that operates and controls the electrical loads 34 when appropriate. Examples of electrical loads 34 may be a fan, an electric heating element and/or an air-conditioning compressor.

The electrified vehicle 10 may be configured to recharge the traction battery 22 from an external power source 36. The external power source 36 may be a connection to an electrical outlet. The external power source 36 may be electrically coupled to a charger or electric vehicle supply equipment (EVSE) 38. The external power source 36 may be an electrical power distribution network or grid as provided by an electric utility company. The EVSE 38 may provide circuitry and controls to regulate and manage the transfer of energy between the power source 36 and the vehicle 10. The external power source 36 may provide DC or AC electric power to the EVSE 38. The EVSE 38 may have a charge connector 40 for plugging into a charge port 42 of the vehicle 10. The charge port 42 may be any type of port configured to transfer power from the EVSE 38 to the vehicle 10. The charge port 42 may be electrically coupled to a charger or on-board power conversion module 44. The power conversion module 44 may condition the power supplied from the EVSE 38 to provide the proper voltage and current levels to the traction battery 22. The power conversion module 44 may interface with the EVSE 38 to coordinate the delivery of power to the vehicle 10. The EVSE connector 40 may have pins that mate with corresponding recesses of the charge port 42. Alternatively, various components described as being electrically coupled or connected may transfer power using a wireless inductive coupling.

One or more wheel brakes 46 may be provided for braking the vehicle 10 and preventing motion of the vehicle 10. The wheel brakes 46 may be hydraulically actuated, electrically actuated, or some combination thereof. The wheel brakes 46 may be a part of a brake system 48. The brake system 48 may include other components to operate the wheel brakes 46. For simplicity, the figure depicts a single connection between the brake system 48 and one of the wheel brakes 46, and connections between the brake system 48 and the other wheel brakes 46 are implied. The brake system 48 may include a controller to monitor and coordinate the brake system 48. The brake system 48 may monitor the brake components and control the wheel brakes 46 for vehicle braking. The brake system 48 may respond to driver commands and may also operate autonomously to implement features such as stability control. The controller of the brake system 48 may implement a method of applying a requested brake force when requested by another controller or sub-function.

Electronic modules in the vehicle 10 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 32. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 10. A vehicle system controller (VSC) 50 may be present to coordinate the operation of the various components.

It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electrical devices as disclosed herein may be configured to execute a computer-program that is embodied in a non-transitory computer readable medium that is programmed to perform any number of the functions as disclosed herein.

The transmission 14 has a case or housing 60, and the gearsets for the transmission 14 which are contained within the case 60. The transmission 14 may be an automatic transmission, or another transmission as is known in the art. The transmission 14 may contains sets of meshed gears and clutches to provide various gear ratios for the vehicle 10. Additionally or alternatively, the transmission 14 may contain one or more planetary gearsets, which may function as a continuously variable transmission. Furthermore, the transmission 14 may include a torque converter in addition to or in place of one or more clutches.

As the transmission 14 operates, the transmission may require cooling and/or lubrication. As such, the transmission 14 has an associated fluid system that contains a transmission fluid. The fluid system is not shown in FIG. 1, but can be understood with later reference to FIG. 3. The transmission fluid system includes valves, pumps and conduits for circulating the fluid through the transmission housing 60. The transmission 14 includes a heat exchanger or automatic transmission fluid cooler for cooling the transmission fluid. The transmission may be configured as a wet sump system that stores the fluid in sump or pan at the bottom of the transmission. Alternatively, the transmission may be configured as a dry sump transmission that stores the fluid in a separate tank or reservoir, with the sump or pan at the bottom of the housing being kept in a dry or semi-dry state. When the transmission operates, rotating elements such as gears and shafts may displace or splash transmission fluid onto other components within the transmission housing 60.

Figure 2:
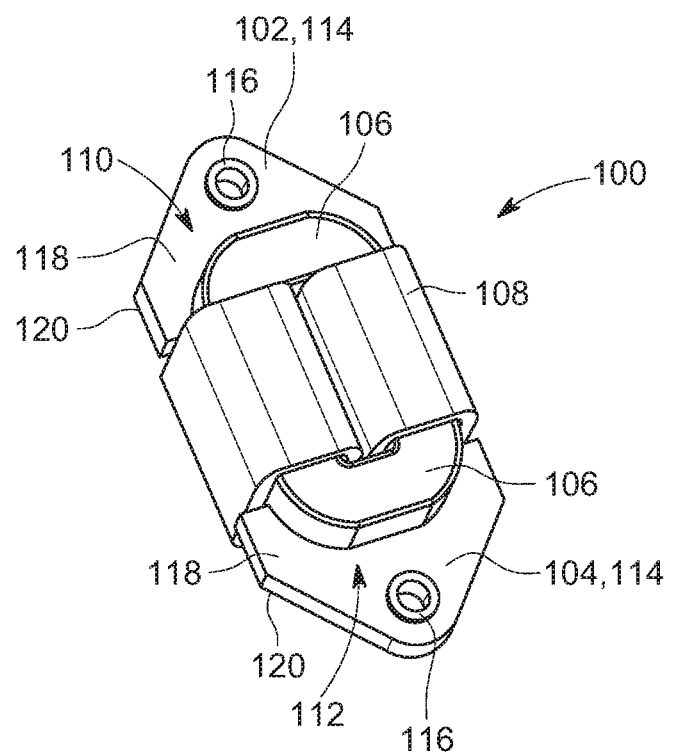
FIG. 2 illustrates a perspective view of an inductor assembly with mounting boards for use with the vehicle of claim 1 according to an embodiment.

FIG. 2 illustrates an inductor assembly 100 and mounting brackets 102, 104 according to an embodiment. The inductor assembly 100 may also be referred to or be incorporated into a variable voltage converter (VVC) 28 or other vehicle power electronics system as described above with respect to FIG. 1. The VVC 28 may include any number of switches, transistors, diodes, and the like, which may be mounted in a separate location from the inductor assembly, and be in electrical communication with the inductor assembly. Note that FIG. 1 is a schematic view of the vehicle 10, and the components may be otherwise positioned or arranged within the vehicle.

The inductor assembly 100 may be mounted within a transmission case 60 as shown above in FIG. 1, such that it is in an interior wet region of the housing 60. In other examples, the inductor assembly 100 may be mounted outside the transmission case 60 and at another location on a structural vehicle component in the vehicle 10. The transmission case 60 or vehicle component provides the structure to support the inductor assembly 100 on the vehicle 10.

The inductor assembly 100 may be provided as a ferro-magnetic-core type inductor. As current is supplied to the inductor assembly 100, a magnetic flux is generated. When the current flowing through the inductor assembly 100 changes, a time-varying magnetic field is created, and a voltage is induced. The inductor assembly 100 may have power losses that contribute to generation of heat during operation. The current capability of the inductor assembly 100 may be limited by the temperature or thermal performance of the inductor assembly. Thermal management and/or cooling of the inductor assembly may dissipate heat, and improve inductor performance and efficiency.

The inductor assembly 100 is illustrated according to an embodiment and includes a core 106 and a winding 108. The core 106 may be formed from one or more sections. In one example, the core 106 is formed from at least two sections, e.g. as two C-shaped sections. In other example, a greater number of core sections may be used. The core sections may collectively form a ring-shaped element. Air gaps, ceramic spacers, adhesive, and the like may be positioned between adjacent core sections. The core 106 may be formed from a magnetic material, such as a ferro-magnetic material.

The winding 108 may be formed as a pair of tubular or helical coils, with each coil surrounding a portion of the core 106. The winding 108 may be formed from a conductive material, such as copper or aluminum. Input and output leads (not shown) extend from the winding 108 and connect to other components of the VVC. An insulator (not shown) may be positioned between the core 106 and the winding 108.

First and second mounting brackets 102, 104 are illustrated as being connected to the inductor assembly 100. The first and second mounting brackets 102, 104 provide a mechanical support to the inductor assembly 100, and facilitate positioning and fixation of the inductor assembly 100 to a vehicle component, such as the transmission housing 60.

The first mounting bracket 102 is connected to a first end region 110 of the inductor assembly. The second mounting bracket 104 is connected to a second end region 112 of the inductor assembly. The second end region 112 of the inductor assembly is opposite to the first end region 110. In other examples, the mounting brackets 102, 104 and/or their associated apertures may be otherwise shaped or oriented. Each mounting bracket 102, 104 may be formed as a plate 114, with an aperture 116 therethrough. The aperture 116 may be reinforced with a metal bushing or sleeve. Each of the mounting brackets 102, 104 may be formed with a first face 118 and a second face 120 opposite to the first face, and the first and second faces 118, 120 may be planar. The aperture 116 may be used with a fastener to connect the inductor assembly 100 to a mounting boss or the like of the vehicle component. In further examples, the two mounting brackets 102, 104 may be integrally formed as a single component to extend circumferentially around the inductor assembly 100 and to the outside of the winding 108.

In the example shown, the first and second mounting brackets 102, 104 are directly connected to the core 106. In one example, the mounting brackets 102, 104 may be formed from a plastic material, via an injection molding process, for example, from a thermoplastic such as polyphenylene sulfide (PPS). In further examples, the mounting brackets 102, 104 may be formed using an injection molding process, and may be directly molded onto the core 106 of the inductor assembly, or may be formed and then attached to the core 106 via an adhesive or the like.

FIGS. 3-6 illustrate the inductor assembly 100 of FIG. 2 with a housing 130 and fluid system 200. In one example, the inductor assembly 100, housing 130, and fluid system 200 may be used with the vehicle 10 of FIG. 1.

A housing 130 is positioned about the inductor assembly 100 or a portion thereof. The housing 130 has a first housing member 132 and a second housing member 134. The first and second housing members 132, 134 cooperate to encapsulate the winding 108 and at least a portion of the core 106 of the inductor assembly. In the example shown, the first and second housing members 132, 134 encapsulate an entirety of both the winding 108 and the core. In another example, the first and second housing members 132, 134 encapsulate an entirety of the winding 108 and only a portion of the core, e.g. the portion of the core 106 that is beneath the winding 108, and the end regions of the inductor assembly and associated core 106 is exposed and outside of the housing.

In one example, the first and second housing members 132, 134 may be formed from a plastic material, via an injection molding process, for example, from a thermoplastic such as polyphenylene sulfide (PPS). In further examples, the first and second housing members 132, 134 may be formed using an injection molding process, and may be directly molded onto the mounting brackets 102, 104 and about the inductor assembly 100, or may be formed and then attached to the mounting brackets 102, 104 and about the inductor assembly 100 via an adhesive or the like.

The first housing member 132 has an outer surface 140 and an inner surface 142. The first housing member 132 defines a first cavity 144, and may be formed as a shell structure. The first housing member 132 defines a first inlet 146 and a first outlet 148. The first inlet 146 and first outlet 148 may be positioned to be opposite to one another on the first housing member 132, e.g. at opposite end regions of the first housing member 132. In other examples, the first inlet 146 and first outlet 148 may be otherwise positioned relative to one another on the first housing member.

The second housing member 134 has an outer surface 150 and an inner surface 152. The second housing member 134 defines a second cavity 154, and may be formed as a shell structure. The second housing member 134 defines a second inlet 156 and a second outlet 158. The second inlet 156 and second outlet 158 may be positioned to be opposite to one another on the second housing member 134, e.g. at opposite end regions of the second housing member. In other examples, the second inlet 156 and second outlet 158 may be otherwise positioned relative to one another on the second housing member.

In one example, the first and second housing members 132, 134 may be provided with mirror symmetry relative to one another about a plane 160 through the first and second mounting brackets 102, 104. As such, the first and second inlets are positioned at a first end region of the inductor assembly, and the first and second outlets are positioned at a second end region of the inductor assembly. Fluid flow through the first housing member 132 is therefore arranged for co-flow with the fluid flow in the second housing member 134. In other embodiments, the inlet and outlet of the first housing member 132 may be arranged in a counterflow configuration with respect to the inlet and outlet of the second housing member 134.

According to an embodiment, and as shown, the first and second housing members 132, 134 are shaped to mate to one another along a plane 160 bisecting the inductor assembly. The plane 160 bisecting the inductor assembly may bisect both of the windings 108 in one example and as shown, or may bisect the core 106 with a winding 108 provided on each side of the plane. In other examples, the first and second housing members 132, 134 may mate or join along another plane that does not bisect the inductor assembly, or may be complexly shaped such that they do not join along a plane.

Additionally, the first and second housing members 132, 134 may be connected to the inductor assembly 100 and one another such that the first and second housing members 132, 134 are not directly joined to one another about an entirety of their respective peripheral edges 162, 164. For example, the first housing member 132 is connected to the first faces 118 of the first and second mounting brackets, and the second housing member 134 is connected to the second faces 120 of the first and second mounting brackets. As such, the mounting brackets 102, 104 may be positioned between the first and second housing members 132, 134 and cooperate in encapsulating the inductor assembly 100 or a portion thereof.

Figure 5:
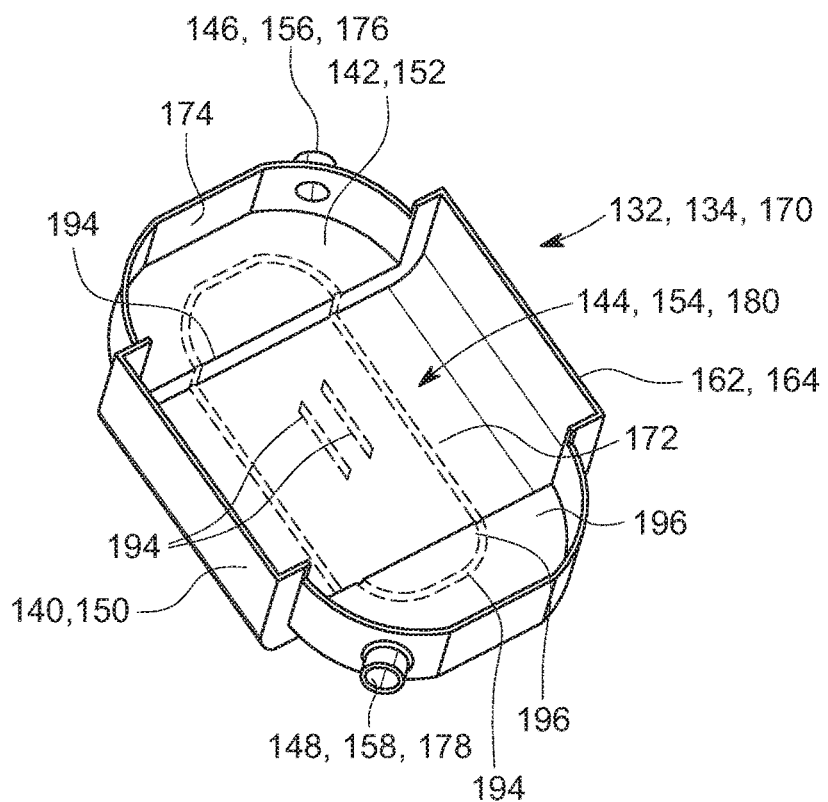
FIG. 5 illustrates a perspective view of a housing member for use with the inductor assembly of FIG. 3.

A housing member 170 is illustrated in FIG. 5, and may be provided as either the first housing member 132 or the second housing member 134 according to the present embodiment. The housing member 170 has a central region 172 that is shaped to generally correspond or correlate to the shape of one side of the inductor assembly 100. A peripheral flange 174 surrounds the central region 172. In the example shown, the peripheral flange 174 defines the inlet 176 and the outlet 178. In other examples, the inlet 176 and outlet 178 may be otherwise located on the peripheral flange 174. Alternatively, the inlet 176 and/or the outlet 178 may be defined by the central region 172. The central region 172 and the peripheral flange 174 cooperate to define a cavity 180 for the housing member.

Figure 6:
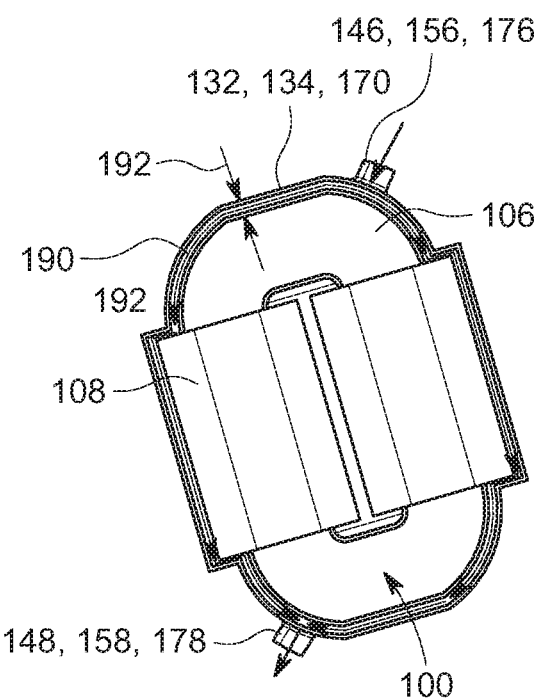
FIG. 6 illustrates a partial section view of the inductor assembly of FIG. 3.

For each of the first and second housing members 132, 134, 170 the associated cavity 144, 154, 180 is sized to form an associated cooling passage 190 between an outer surface of the inductor assembly 100 and the associated housing member 132, 134, 170. A sectional schematic view of the inductor assembly 100 and a housing member 170 (including housing member 132 or 134) is shown in FIG. 6. Note that the mounting brackets 102, 104 are not illustrated in FIG. 6. The cavity 180 may be sized such that there is a substantially constant gap or distance 192 between the outer surface of the inductor assembly 100 and the housing member 170.

As the fluid flow enters the housing member 170 as shown in FIG. 6 via the inlet 176, the fluid divides to flow through the cooling passage 190 around the inductor assembly 100. Depending on the structure of the winding 108 and core 106, the fluid may additionally flow through the winding 108 and/or core 106, or between the winding 108 and the core 106. The fluid flows meet and recombine adjacent to and upstream of the outlet 178 of the housing member, and then flow through the outlet 178. As the fluid flow is in direct contact with the winding 108 and core 106 of the inductor assembly, heat transfer from the inductor assembly 100 to the fluid is increased via both convective and conductive heat transfer pathways. With the fluid flow in the passage 190 being in direct contact with the inductor assembly 100, no additional potting or thermal greases are required between the inductor assembly 100 and the fluid in the cooling passage 190, and heat transfer is increased.

In some embodiments, the housing members 132, 134 may have additional features such as locating members 194 for the inductor assembly. As shown in FIG. 5, the stepped region in the central region may act as a locating member 194 and act to prevent or reduce movement of the inductor assembly along one axis. The housing members 132, 134 may additionally be provided with locating members 194 (shown in broken lines) such as flanges and the like that are formed to extend into the cavity 180 to maintain the position of the inductor assembly 100 relative to the housing member 170 in multiple degrees of translational movement, and also to maintain the size of the cooling passage 190 and an open flow path. In other embodiment, the housing members 132, 134 may be provided without locating members 194.

One or both of the housing members 132, 134 may additionally have an associated series of flow guides 196 (shown in broken lines) to direct and distribute fluid flow within the cooling passage 190 formed between the housing member 170 and the inductor assembly 100, and also to better control the heat transfer to the fluid and the thermal management of the inductor assembly 100. A flow guide in the series of flow guides 196 may include a vane, a rib, a baffle, a channel, a groove, or the like. The series of flow guides 196 may have one type of flow guide, or a combination of different flow guides. The flow guides 196 may have various shapes and structures, including linear sections, curved sections, sections with varying depths or heights, sections with constant depths or heights, and the like. The inner surface of the housing member 170 defining the cavity 180 and/or the surface of the flow guides 196 may be provided with a surface texture to further enhance mixing, direct or control fluid flow, or induce turbulent flow for increased heat transfer.

In one example, and as shown, the first and second cavities 144, 154 of the first and second housing members 132, 134 are substantially fluidly separate from one another. "Substantially" as referred to herein means that the fluid flow within the fluid passage 190 of one housing member does not directly flow into the fluid passage 190 of the other housing member; however, depending on the structure and flow path through the winding 108 and core, there may be some fluid crossover from one cavity to the other. The fluid crossover may be on the order of twenty percent or less, ten percent or less, or five percent or less.

Figure 3:
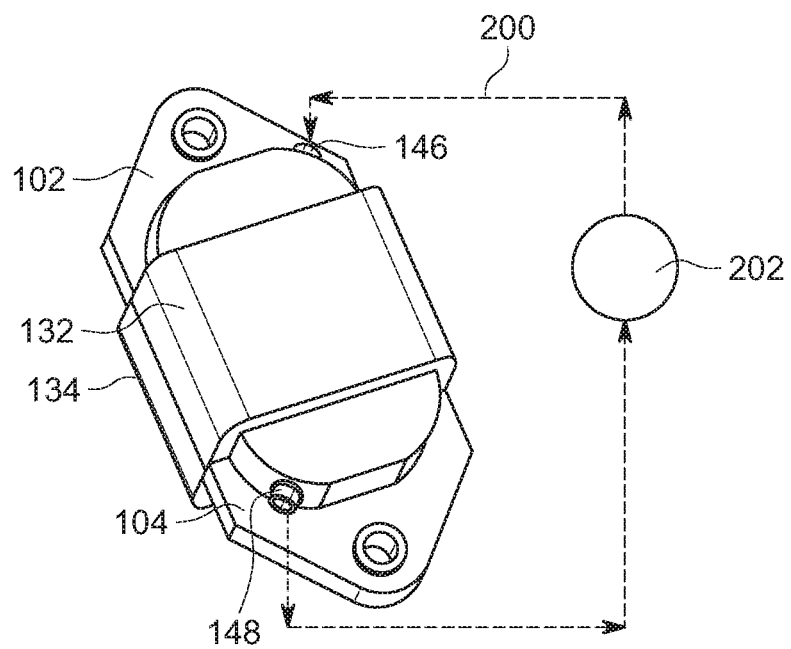
FIG. 3 illustrates a schematic view of a fluid system with the inductor assembly, mounting boards, and housing for use with the vehicle of claim 1 according to an embodiment.
Figure 4:
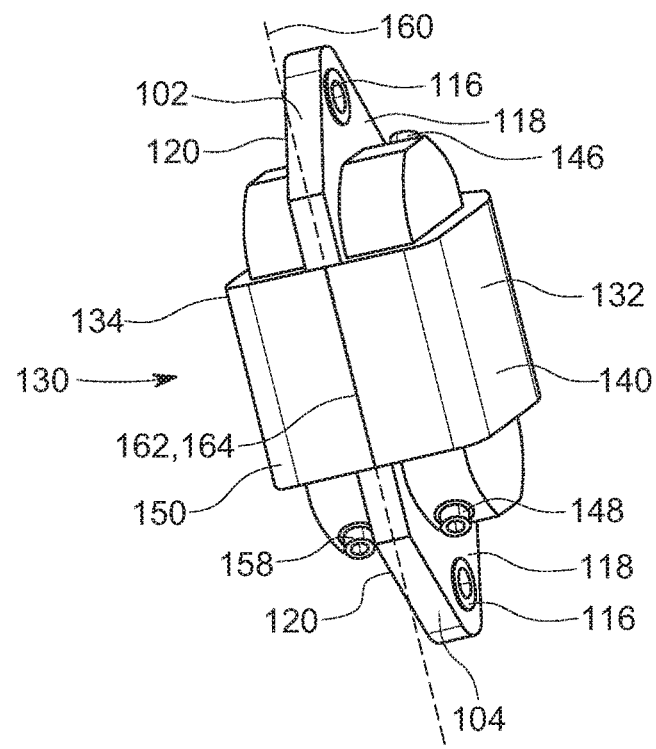
FIG. 4 illustrates another perspective view of the inductor assembly, mounting boards, and housing of FIG. 3.

As shown in FIG. 3, a fluid system 200 is connected to the first inlet 146, the second inlet 156, the first outlet 148, and the second outlet 158 to provide pressurized fluid to the first and second inlets 146, 156 to circulate fluid through the housing 130. Note that the connections to the second inlet and second outlet are obscured in the Figure; however, the flow paths are illustrated. An electric pump 202 may be provided in the fluid system to pressurize the fluid. The fluid system 200 may be an open loop system or a closed loop system.

According to a further example, the fluid system 200 is in fluid communication with or fluidly connected to the transmission 14 fluid system, such that the fluid in the fluid system 200 is transmission fluid. For an open loop system fluidly connected to the transmission 14, the pump 202 of the fluid system 200 receives fluid from a sump or other reservoir in the transmission case 60, directs pressurized fluid to the inlets 146, 156 of the housing 130, and the outlets 148, 158 of the housing 130 open into an interior region of the transmission case 60 such that the fluid drains out of the housing 130 and into the sump. For a closed loop system, the pump 202 of the fluid system 200 directs pressurized fluid to the inlets 146, 156 of the housing 130, and the outlets 148, 158 of the housing 130 have fluid lines to direct pressurized flow of the fluid back to the pump 202. In either system, additional elements such as a heat exchanger, valves, filters and the like may be provided.

The pump 202 may be an electrically operated pump, e.g. connected to an electric motor, such that the pump may be operated to circulate fluid independent of the transmission or driveline state.

A controller 204 is in communication with the pump 202, and the controller 204 may be provided as a separate pump controller, or may be provided as another vehicle controller, such as a transmission control unit, an electronics or electrical power controller, or another vehicle system controller 50. The controller 204 is configured to operate the pump 202 to circulate fluid through the housing 130 to cool the inductor assembly 100. In one example, the controller 204 controls the pump 202 to provide pressurized fluid to the first and second inlets 146, 156 in response to a current through the inductor assembly 100 being above a threshold value. The threshold value may be zero, or may be a value other than zero. In other words, the controller 204 may control the pump 202 to circulate fluid through the inductor assembly 100 in response to the inductor assembly 100 operating. Additionally, for fluid cavities that are separate or substantially separate from one another, the fluid flowing through each of the fluid cavities may be separately or individually controlled to further improve thermal management of the inductor assembly.

In one example, the inductor assembly 100 and housing 130 may be positioned such that each inlet 146, 156 is positioned vertically or generally vertically above the associated outlet 148, 158. As such, flow of the fluid through the associated housing member 132, 134 is further assisted by gravity. "Generally" as used herein refers to being within twenty degrees, ten degrees, or five degrees of the stated orientation. In other examples, and with sufficient pressure of the fluid at the inlet, the inlets 146, 156 and outlets 148, 158 may be otherwise oriented relative to one another.

Figure 7:
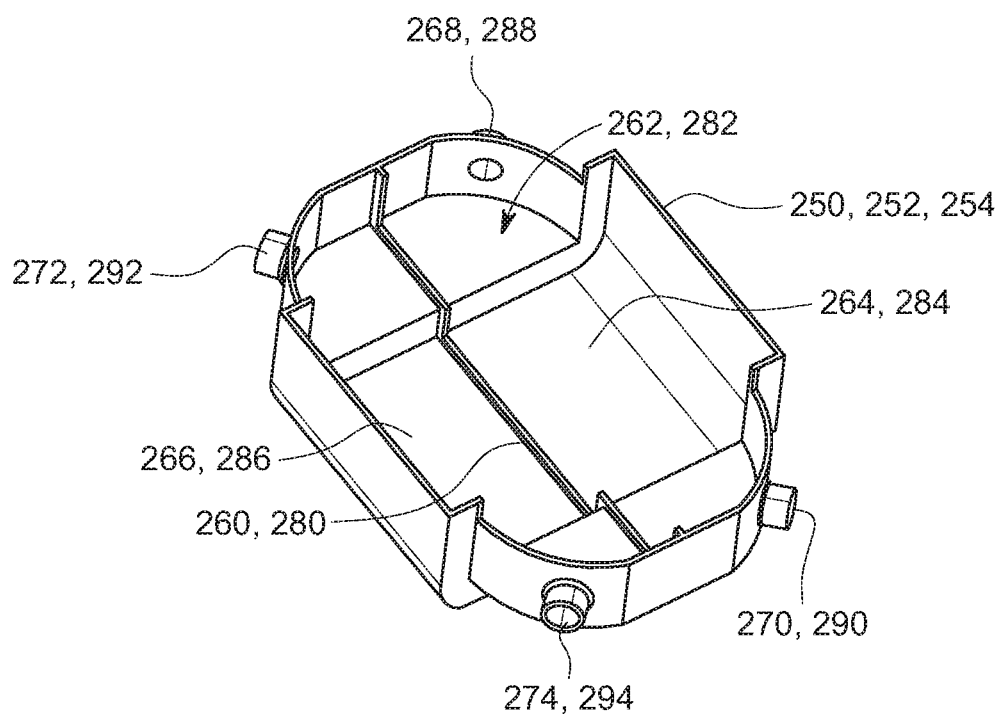
FIG. 7 illustrates a perspective view of a housing member according to another embodiment for use with the inductor assembly of FIG. 2.
Figure 8:
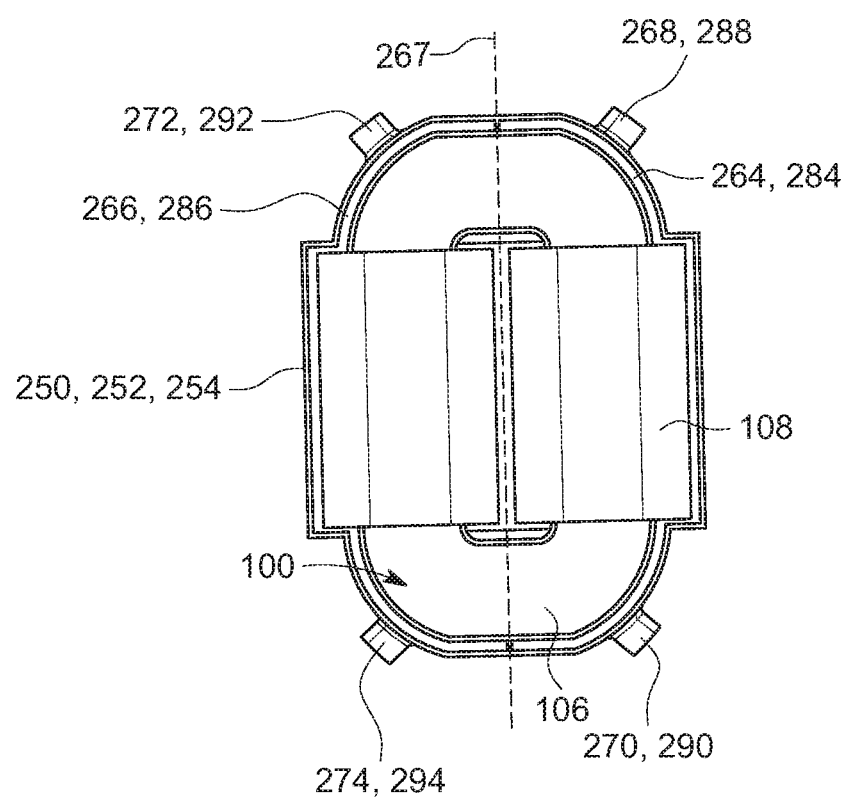
FIG. 8 illustrates a partial section view of the housing member of FIG. 7 and the inductor assembly of FIG. 2.

FIGS. 7-8 illustrate the inductor assembly of FIG. 2 with a one housing member for a housing 250 according to another example. The housing 250 may have additional features such as locating members, flow guides, and the like, as described above with respect to housing 130. The housing 250 may be connected to a fluid system 200 as described above. Details for the housing 250 that differ from the housing 130 as described above are provided below.

The housing 250 may use a pair of housing members as shown in FIG. 7, e.g. a first housing member 252 and a second housing member 254. The first and second housing members 252, 254 cooperate to encapsulate the inductor assembly 100 or a portion thereof for direct cooling with a fluid. Mounting brackets, such as brackets 102, 104 may additionally be provided. A sectional schematic view of the inductor assembly 100 and either housing member 252 or housing member 254 is shown in FIG. 8.

The first housing member 252 has a first shield member 260 that protrudes into the first cavity 262 defined by the member 252 and divides the first cavity into a first fluid chamber 264 and a second fluid chamber 266. The first shield member 260 may act to separate or substantially separate fluid flows in the first and second chambers 264, 266 from one another. In one example, the first shield member 260 extends to and is in contact with the core 106 at a location between the two windings 108 to provide the separation and seal the fluid chambers from one another along plane 267. A first inlet 268 and a first outlet 270 are associated with the first fluid chamber 264, and are positioned to circulate fluid through the first fluid chamber 264. A second inlet 272 and a second outlet 274 are associated with the second fluid chamber 266, and are positioned to circulate fluid through the second fluid chamber 266.

The second housing member 254 has a second shield member 280 that protrudes into the second cavity and divides the second cavity 282 into a third fluid chamber 284 and a fourth fluid chamber 286. The second shield member 280 may act to separate or substantially separate fluid flows in the third and fourth chambers 284, 286 from one another. In one example, the second shield member 280 extends to and is in contact with the core 106 at a location between the two windings 108 to provide the separation and seal the fluid chambers along plane 287. A third inlet 288 and a third outlet 290 are associated with the third fluid chamber 284, and are positioned to circulate fluid through the third fluid chamber 284. A fourth inlet 292 and a fourth outlet 294 are associated with the fourth fluid chamber 286, and are positioned to circulate fluid through the fourth fluid chamber 286.

By further dividing the housing members into multiple chambers, control of the fluid flow over the inductor assembly 100 is further increased, thereby allowing for improvements in thermal management of the inductor assembly and a more homogeneous temperature of the inductor assembly. Furthermore, each housing member may be further divided into additional fluid chambers with associated inlets and outlets to provide even more discretized control over the fluid and cooling of the inductor assembly. Additionally, as the fluid chambers are separate or substantially separate from one another, the fluid flowing through each of the fluid chambers may be separately or individually controlled to further improve thermal management of the inductor assembly. Additionally, each chamber may be arranged for co-flow or counterflow with respect to another chamber in the housing.

While exemplary embodiments are described above, it is not intended that these embodiments describe all possible forms of the invention or disclosure. Rather, the words used in the specification are words of description rather than limitation, and it is understood that various changes may be made without departing from the spirit and scope of the disclosure. Additionally, the features of various implementing embodiments may be combined to form further embodiments of the invention or disclosure.

What is claimed is:

1. A vehicle comprising:
   a vehicle electrical system with a variable voltage converter (VVC) and an inductor assembly, the inductor assembly having a core and a winding;
   a housing with a first housing member and a second housing member, the first and second housing members cooperating to encapsulate the winding and at least a portion of the core of the inductor assembly, the first housing member defining a first inlet and a first outlet, the second housing member defining a second inlet and a second outlet; and
   a fluid system connected to the first inlet, the second inlet, the first outlet, and the second outlet to provide pressurized fluid to the first and second inlets to circulate fluid through the housing and about an outer peripheral surface of the inductor assembly;
   wherein the first inlet and the first outlet are positioned at opposite end regions of the first housing member;
   wherein the second inlet and the second outlet are positioned at opposite end regions of the second housing member;
   wherein the first inlet is positioned at a first end region of the inductor assembly, and the first outlet is positioned at a second end region of the inductor assembly, the second end region of the inductor assembly being opposite to the first end region of the inductor assembly; and
   wherein the second inlet is positioned at the second end region of the inductor assembly, and the second outlet is positioned at the first end region of the inductor assembly.

2. The vehicle of claim 1 wherein the first housing member defines a first cavity;
   wherein the second housing member defines a second cavity; and
   wherein the first and second cavities are sized to form an associated cooling passage between an outer surface of the inductor assembly and the associated housing member.

3. The vehicle of claim 1 further comprising a transmission with a transmission case;
   wherein the fluid in the fluid system is a transmission fluid circulated within the transmission case; and
   wherein the inductor assembly is positioned inside an interior of the transmission case.

4. The vehicle of claim 1 wherein the fluid system has an electrically driven pump; and
   wherein the vehicle further comprises a controller configured to, in response to a current of the inductor assembly being above a threshold value, operate the pump to cool the inductor assembly.

5. The vehicle of claim 2 wherein the first and second cavities are fluidly separate from one another.

6. The vehicle of claim 2 wherein the first housing member defines a first series of flow guides to direct fluid flow within the cooling passage of the first cavity; and
   wherein the second housing member defines a second series of flow guides to direct fluid flow within the cooling passage of the first cavity.

7. The vehicle of claim 3 wherein the first and second outlets of the first and second housing members of the inductor assembly drain directly into the interior of the transmission case.

8. A vehicle comprising:
   a vehicle electrical system with a variable voltage converter (VVC) and an inductor assembly, the inductor assembly having a core and a winding;
   a housing with a first housing member and a second housing member, the first and second housing members cooperating to encapsulate the winding and at least a portion of the core of the inductor assembly, the first housing member defining a first inlet and a first outlet, the second housing member defining a second inlet and a second outlet and
   a fluid system connected to the first inlet, the second inlet, the first outlet, and the second outlet to provide pressurized fluid to the first and second inlets to circulate fluid through the housing;
   wherein the first housing member defines a first cavity;
   wherein the second housing member defines a second cavity;
   wherein the first and second cavities are sized to form an associated cooling passage between an outer surface of the inductor assembly and the associated housing member; and
   wherein the first housing member further defines a third inlet and a third outlet, wherein the first housing member defines a first shield member protruding into the first cavity to divide the first cavity into a first fluid chamber and a second fluid chamber, wherein the first inlet and the first outlet are positioned to circulate fluid through the first fluid chamber, and wherein the third inlet and the third outlet are positioned to circulate fluid through the second fluid chamber.

9. The vehicle of claim 8 wherein the second housing member defines a fourth inlet and a fourth outlet, wherein the housing defines a second shield member protruding into the second cavity to divide the second cavity into a third fluid chamber and a fourth fluid chamber, wherein the second inlet and the second outlet are positioned to circulate fluid through the third fluid chamber, and wherein the fourth inlet and the fourth outlet are positioned to circulate fluid through the fourth fluid chamber.

10. The vehicle of claim 8 wherein the first inlet and the first outlet are positioned at opposite end regions of the first housing member; and wherein the second inlet and the second outlet are positioned at opposite end regions of the second housing member.

11. The vehicle of claim 8 further comprising a first mounting bracket and a second mounting bracket, each mounting bracket connected to the inductor assembly, each of the mounting brackets defining an aperture therethrough to connect the inductor assembly to the vehicle.

12. The vehicle of claim 8 further comprising a transmission with a transmission case;
wherein the fluid in the fluid system is a transmission fluid circulated within the transmission case.

13. The vehicle of claim 8 wherein the fluid system has an electrically driven pump; and
wherein the vehicle further comprises a controller configured to, in response to a current of the inductor assembly being above a threshold value, operate the pump to cool the inductor assembly.

14. The vehicle of claim 10 wherein the first inlet and the second inlet are positioned at a first end region of the inductor assembly.

15. A vehicle comprising:
a vehicle electrical system with a variable voltage converter (VVC) and an inductor assembly, the inductor assembly having a core and a winding;
a housing with a first housing member and a second housing member, the first and second housing members cooperating to encapsulate the winding and at least a portion of the core of the inductor assembly, the first housing member defining a first inlet and a first outlet, the second housing member defining a second inlet and a second outlet and a fluid system connected to the first inlet, the second inlet, the first outlet, and the second outlet to provide pressurized fluid to the first and second inlets to circulate fluid through the housing;
wherein the first and second housing members mate along a plane bisecting the inductor assembly.

16. The vehicle of claim 15 wherein the first inlet and the first outlet are positioned at opposite end regions of the first housing member;
wherein the second inlet and the second outlet are positioned at opposite end regions of the second housing member; and
wherein the first inlet and the second inlet are positioned at a first end region of the inductor assembly.

17. The vehicle of claim 10 further comprising a first mounting bracket and a second mounting bracket, each mounting bracket connected to the inductor assembly, each of the mounting brackets defining an aperture therethrough to connect the inductor assembly to the vehicle.

18. The vehicle of claim 17 wherein the first mounting bracket is connected to a first end region of the inductor assembly, and the second mounting bracket is connected to a second end region of the inductor assembly, the second end region of the inductor assembly being opposite to the first end region.

19. The vehicle of claim 17 wherein each of the first and second mounting brackets have a first face and a second face opposite to the first face;
wherein the first housing member is connected to the first faces of the first and second mounting brackets; and
wherein the second housing member is connected to the second faces of the first and second mounting brackets.

20. The vehicle of claim 17 wherein the first and second housing members cooperate to encapsulate an entirety of the core of the inductor assembly.

* * * * *